United States Patent [19]

Baker

[11] Patent Number: 4,489,238

[45] Date of Patent: Dec. 18, 1984

[54] INFRARED RADIATION DETECTOR

[75] Inventor: Geoffrey Baker, Southampton, England

[73] Assignee: U.S. Philips Corporation, New York, N.Y.

[21] Appl. No.: 395,158

[22] Filed: Jul. 6, 1982

[30] Foreign Application Priority Data

Jul. 17, 1981 [GB] United Kingdom ............. 8122186

[51] Int. Cl.³ .............................................. G01J 1/00
[52] U.S. Cl. .................................. 250/338; 250/349; 357/72; 357/75
[58] Field of Search ............... 357/72, 75; 250/338, 250/340, 342, 332, 330, 349; 136/213; 29/592

[56] References Cited

U.S. PATENT DOCUMENTS 3,581,092 5/1971 Pearsall et al. ................. 250/349
4,367,408 1/1983 Imai et al. ..................... 250/338 PY
4,383,174 5/1983 Matsumura et al. ........... 250/338 PY Primary Examiner—Alfred E. Smith
Assistant Examiner—Carolyn E. Fields
Attorney, Agent, or Firm—Marc D. Schechter

[57] ABSTRACT

The detector has a pyroelectric element sandwiched between two electrodes which are transparent to the wavelength of radiation to be detected. The pyroelectric element is maintained in spaced relationship to the surface of a header by a pillar and by a lead of a microminiature package which is mounted on its back on the header surface. A second pyroelectric element can be similarly supported by another lead and another pillar. Electrical connections between the remaining leads and the posts of the header, and between the upper electrodes of the pyroelectric elements can be made with metal foil straps, thus eliminating the need for bonded wires.

19 Claims, 3 Drawing Figures

INFRARED RADIATION DETECTOR

BACKGROUND OF THE INVENTION

This invention relates to an infrared radiation detector comprising a pyroelectric element sandwiched between two electrodes. The pyroelectric element is maintained in spaced relation to a supporting surface by support means. The detector further comprises a circuit arrangement with at least one circuit element connected electrically to one of the electrodes.

Infrared detectors can be used, for example, in intruder alarms. It is because the intruder is a moving source of infrared radiation that his presence can be detected. The infrared radiation emitted by the intruder is converted by the detector into an electric signal which can be used to actuate an alarm.

In order that the detector is well isolated from detrimental environmental effects and for maximum performance at low frequencies, it is common to mount the element so that it is spaced apart from a supporting surface. This minimizes heat transfer from other parts of the detector to the pyroelectric element and lengthens the thermal time constant.

A basic infrared detector may comprise a single pyroelectric element sandwiched between two electrodes. As the pyroelectric element has a relatively high impedance it is customary to include a circuit element in the form of a field effect transistor (hereinafter referred to as an F E T), which acts as an amplifier stage or impedance matching means. The gate of the FET is connected to one of the two electrodes.

In more sophisticated detectors, the circuitry (which is located in the proximity of and in the same envelope as the pyroelectric element) may be more complex. For example, United Kingdom patent GB No. 1,580,403 describes a detector which also includes a nonlinear network which protects the gate of the FET from excessive voltages resulting from large or sudden changes in input radiation.

As described in that patent, the pyroelectric element is maintained in spaced relation to the supporting surface of a header by a U-shaped plinth member. The circuit elements which are located in the proximity of the pyroelectric element are unencapsulated chips. The various electrical connections to these chips are made by bonded wires. Unfortunately, the technique of wire bonding is both expensive and difficult to perform accurately so that the yield of usefully bonded detectors can be undesirably restricted.

Also, there is another problem which results from the use of unencapsulated chips, namely the difficulty of performing certain desirable tests on the chip, for example measurement of low leakage current and low voltage noise of the circuit elements. These tests can be carried out after the chips have been included in the detector, however it is then too late to identify an unsuitable chip until the detector is virtually complete. It can be expensive to test the chips at this late stage because an unsuitable chip then results in the rejection not only of the chip itself, but also of the whole detector comprising that chip.

SUMMARY OF THE INVENTION

According to the present invention, an infrared detector comprises a pyroelectric element sandwiched between two electrodes. The pyroelectric element is maintained in spaced relation to a supporting surface by support means. The detector further comprises a circuit arrangement with at least one circuit element electrically connected to one of the electrodes. The circuit arrangement is encapsulated within a package which is present on the supporting surface and which has protruding conductive leads electrically connected to the circuit arrangement. The support means for supporting the pyroelectric element comprises one of the leads.

By using a lead of the encapsulating package to support the pyroelectric element the electrical connection between the circuit element and the pyroelectric element can be made without the need for a bonded wire. Thus, the number of bonded wires in a complete detector can be significantly reduced. (As will become apparent from the following description, in some cases a detector can be made without any bonded wires at all.) This has the advantage that detectors can be made more simply and more accurately resulting in decreased manufacturing costs and increased yields, both of which effects contribute to a reduction in cost of the final detector.

The use of a circuit arrangement encapsulated within a package, having protruding conductive leads is beneficial on two counts. Firstly, assembly of the detector is simplified. Secondly, the circuit arrangement can then be subjected to the various tests mentioned above. Thus, an unsuitable circuit arrangement can be identified and rejected before it is included in the detector. This results in a further increase in the yield of useful detectors.

The pyroelectric element can be supported at one end by a conductive lead of the package and at the opposite end by a separate supporting pillar which can be substantially smaller, and so cheaper, than the plinth used in the prior art detector mentioned above.

The encapsulating package may be a so-called microminiature package, which basically is a small block of plastic material encapsulating the circuit arrangement. The circuit arrangement may comprise a single circuit element or a plurality of circuit elements. Conductive leads which extend from the side faces of the package are connected electrically to the circuit arrangement as appropriate. The package has two major faces and the conductive leads, for their major part, extend transversely thereto. In addition the leads extend transverse to one of the major faces for connection purposes.

It is conventional to mount a microminiature package such that the leads extend toward a supporting surface. For example, the supporting surface may well be a printed circuit board. In this case the leads of the microminiature package are connected to appropriate conductors on the circuit board. In contrast, as will become clearer from the following description, if a microminiature package is used in a detector according to the invention, it is mounted so that its conductive leads extend away from the supporting surface. As compared with the conventional mode of mounting, the microminiature package is now effectively upside down.

The detector may comprise one or two pyroelectric elements; if two, they are connected in series. A detector with two such pyroelectric elements, usually referred to as a Dual detector, has one electrode which is common to both pyroelectric elements or an electrode of one element which is electrically connected to an electrode of the other element. In a conventional Dual detector these electrodes face the supporting surface, whereas in a detector according to the invention they are directed away from the surface.

DESCRIPTION OF THE PREFERRED EMBODIMENTS

Figure 1:
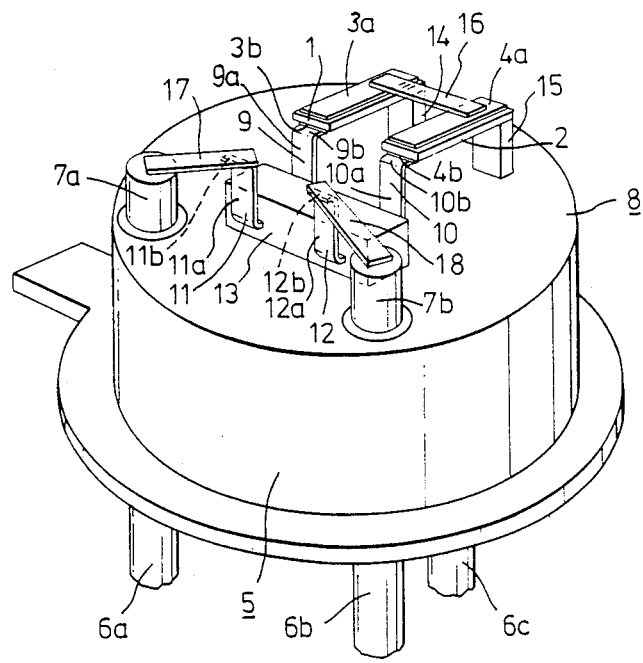
FIG. 1 is a perspective view of an infrared radiation detector according to the invention.

The infrared radiation detector shown in FIG. 1 is a Dual detector comprising two pyroelectric elements 1 and 2 which are formed from two separate bodies of pyroelectric material such as lanthanum-doped and manganese-doped lead zirconate titanate. For more information about this material reference is made to United Kingdom patent GB Pat. No. 1,504,283.

Each element 1 and 2 which may be 2 mm.×1 mm.×150 micrometers, is sandwiched between two nichrome electrodes 3a and 3b and 4a and 4b. The uppermost electrodes 3a and 4a are substantially transparent to the infrared radiation of a wavelength at which the detector is responsive. The electrodes 3a, 3b, 4a, and 4b, cover the majority of the major surfaces of the elements 1 and 2. The elements 1 and 2 are spaced apart from the base of an envelope in the form of a three lead header 5 which may have a conventional TO-5 outline. Two of the leads 6a and 6b extend through the header 5 to form two posts 7a and 7b, respectively, which protrude above a substantially flat surface 8 of the header 5. The third lead 6c is conductively connected to the surface 8.

Figures 2, 3:
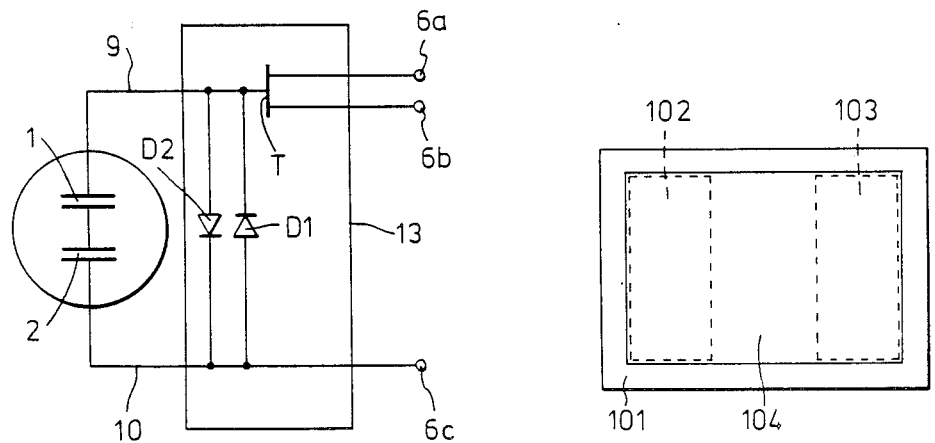
FIG. 2 schematically shows a circuit arrangement for a detector according to the invention.
FIG. 3 is a top plan view, of an alternative form of pyroelectric element for the detector of FIG. 1.

The pyroelectric elements 1 and 2 are maintained in spaced relation to surface 8 by support means. These support means comprise conductive leads 9 and 10 and pillars 14 and 15. The leads 9 and 10 protrude from a side face of a so-called microminiature package 13 which basically is a small rectangular block of plastic material encapsulating a circuit arrangement. In this case the circuit arrangement comprises a field effect transistor T and two diodes D1 and D2 which are connected as shown in FIG. 2. Such a package is a four lead device having two tab-like leads symmetrically extending from each of two opposite side faces of the package. The package dimensions are approximately 2.85 mm.×1.25 mm.×0.8 mm. Using an epoxy adhesive the package 13 is fixed to the surface 8 by one of its major surfaces such that the protruding leads 9, 10, 11 and 12 extend away from surface 8.

Each lead 9, 10, 11 and 12 has a main portion in the form of a leg 9a, 10a, 11a and 12a respectively. These legs, which are transverse to surface 8, extend above the upper face of the microminiature package 13. Also the leads 9, 10, 11 and 12 each have an end portion remote from the package 13 in the form of feet 9b, 10b, 11b and 12b respectively. These feet are transverse to the legs and extend substantially parallel to surface 8. In this way the electrodes 3b and 4b of the pyroelectric elements 1 and 2 respectively, bear on the feet 9b and 10b. Electrodes 3b and 4b are secured to feet 9b and 10b using a conductive adhesive such as Ablebond 36/2 (Trade Mark) available from Ablestik Laboratories, U.S.A.

The electrodes 3b and 4b also bear on the pillars 14 and 15 respectively. Pillar 14 is made of an insulating material, for example a ceramic such as high density alumina, while pillar 15 is electrically conductive. In fact pillar 15 may be made of an insulating material but with a conductive coating of for example, gold. Also, it is noted here that instead of using two separate pillars it is possible to use a single insulating pillar in the form of a block with a portion having a conductive coating for electrically connecting electrode 4b to the surface 8. In this case, the insulating portion of the block separates electrode 3b from the base of the header. Thus electrode 4b of element 2 is conductively connected to surface 8 and so to the lead 6c of header 5.

The electrodes 3a and 4a are electrically connected by a conductive foil strap 16 which may be made of gold. This strap 16 is bonded to the electrodes 3a and 4a using a conductive adhesive. Electrode 4b is similarly bonded to pillar 15. The bond between electrode 3b and pillar 14 can be made using a nonconductive epoxy adhesive.

The two leads 11 and 12 of the microminiature package 13 which do not support the pyroelectric elements are conductively connected to the leads 6a and 6b of the header 5 via the posts 7a and 7b respectively. This connection may be made by metal foil straps 17 and 18 made of, for example, gold. The strap 17 bears on post 7a and the foot 11b of lead 11, strap 18 similarly bears on post 7b and foot 12b of lead 12. These straps 17 and 18 can be secured using an electrically conductive adhesive.

At this point it is noted that instead of using metal foil for the straps 16, 17 and 18 metal bars or wires may be used instead.

The electric circuit set up by the circuit elements in package 13 and the various connections is shown in FIG. 2. As is conventional, the pyroelectric elements 1 and 2 are represented as capacitors. For more detailed information about this circuit arrangement reference is made to United Kingdom Patent GB No. 1,580,403. Briefly, it can be said that this diode arrangement protects the gate of the field effect transistor T (which forms part of an impedance matching circuit) from excessive voltages and progressively limits the pyroelectric voltage resulting from large changes in ambient temperature.

The pyroelectric detector is completed by securing a conventional cover member (not shown) to the rim of the header 5 in known manner. The cover member has a window which is transparent to infrared radiation.

The detector described so far is a Dual detector comprising two pyroelectric elements formed from two separate bodies of pyroelectric material. As an alternative to this, the two pyroelectric elements may be formed from a common pyroelectric body 101 having two electrodes 102 and 103 on a first major surface, and having a single common electrode 104 on a second opposite major surface (see FIG. 3). This single body can replace the separate pyroelectric elements 1 and 2 shown in FIG. 1. In this case, the electrodes 102 and 103 face the surface 8 of header 5 and electrode 104 is directed away from that surface. The electrodes 102 and 103 are bonded to leads 9a and 9b of the microminiature package 13 and to the pillars 14 and 15, respectively as previously described.

The invention is also applicable to infrared radiation detectors comprising a single pyroelectric element similarly sandwiched between two electrodes. If such an element is used with the microminiature package described above then lead 9a of the package 13 supports the element at one end and an electrically conductive pillar (e.g. a pillar with a conductive coating) supports it at the opposite end. The lower electrode is bonded conductively to lead 9 and the conductive pillar. The upper electrode is conductively connected to lead 10 of the package 13. This connection can be made using a strap of conductive foil. The other leads 11 and 12 of package 13 are connected to the posts of the header as described above.

Of course the package may contain a circuit arrangement different from that described above. For example, it may contain a single circuit element such as a field effect transistor. In this case the package only has three conductive leads extending therefrom. These leads are connected respectively to the gate, source and drain of the transistor. The lead connected to the gate can be used to support a single pyroelectric element, the lower electrode of this element being conductively bonded to that lead. The source and drain leads are connected to the posts of the header as before. The pyroelectric element can be supported at the end remote from the gate lead by an insulating pillar. A conductive connection then has to be made between the upper electrode of the element and the base of the header. This connection may be in the form of a wire bond, but because the contact areas of the electrode and header are relatively large there is no major difficulty in correctly aligning the bonding apparatus to make this bond.

I claim:

1. An infrared radiation detector comprising:
   a substrate having a supporting surface;
   a pyroelectric element sandwiched between two electrodes;
   support means for supporting the pyroelectric element and for spacing the pyroelectric element from the supporting surface; and
   a circuit arrangement having at least one circuit element electrically connected to one of the electrodes;
   characterized in that:
   the circuit arrangement is encapsulated in a package which has protruding conductive leads electrically connected to the circuit arrangement;
   the circuit arrangement package is disposed on the supporting surface; and
   the support means comprises a first protruding conductive lead.

2. An infrared radiation detector as claimed in claim 1, characterized in that the support means further comprises an insulating pillar mounted on the supporting surface.

3. An infrared radiation detector as claimed in claim 2, characterized in that:
   the circuit arrangement package has a substantially flat face which is fixed to the supporting surface; and
   the protruding leads extend away from the supporting surface.

4. An infrared radiation detector as claimed in claim 3, characterized in that the first protruding lead extends up from the supporting surface and has an end portion remote from the package which extends substantially parallel to the supporting surface, the pyroelectric element bearing on the end portion.

5. An infrared radiation detector as claimed in claim 4, characterized in that the circuit arrangement comprises a field effect transistor having a gate electrically connected to the first lead.

6. An infrared radiation detector as claimed in claim 5, characterized in that:
   the detector comprises two pyroelectric elements; and
   the support means further comprises a second lead protruding from the circuit arrangement package.

7. An infrared radiation detector as claimed in claim 6, characterized in that the circuit arrangement comprises a pair of diodes connected oppositely in parallel between the first and second leads.

8. An infrared radiation detector as claimed in claim 7, characterized in that:
   the two pyroelectric elements are two separate pyroelectric elements, each sandwiched between two electrodes;
   and
   when the two pyroelectric elements are mounted on the supporting means, the electrodes from the two pyroelectric elements which face away from the supporting surface are connected by a conductive strap.

9. An infrared radiation detector as claimed in claim 8, characterized in that the support means further comprises an electrically conducting pillar mounted on the supporting surface.

10. An infrared radiation detector as claimed in claim 9, characterized in that the insulating pillar is partially provided with an electrically conductive coating.

11. An infrared radiation detector as claimed in claim 10, characterized in that the detector further comprises:
    an envelope having a base, said base having a substantially flat surface which forms the supporting surface;
    and
    conductive wires which extend through the base to form at least two posts which protrude above the surface of the base.

12. An infrared radiation detector as claimed in claim 11, characterized in that:
    the field effect transistor has a source and a drain separately electrically connected to third and fourth conductive leads protruding from the package; and
    the device further comprises conductive straps for electrically connecting each of the third and fourth conductive leads to a separate one of the posts.

13. An infrared radiation detector as claimed in claim 12, characterized in that the third and fourth leads each extend up from the supporting surface and each have an end portion remote from the package which extends substantially parallel to the supporting surface, the conductive straps each bearing on an end portion.

14. An infrared radiation detector as claimed in claim 7, characterized in that the two pyroelectric elements are a single pyroelectric body having first and second opposite surfaces, the first surface having two electrodes thereon and the second surface having one electrode thereon opposite to the two electrodes on the first surface.

15. An infrared radiation detector as claimed in claim 14, characterized in that the support means further comprises an electrically conducting pillar mounted on the supporting surface.

16. An infrared radiation detector as claimed in claim 15, characterized in that the insulating pillar is partially provided with an electrically conductive coating.

17. An infrared radiation detector as claimed in claim 16, characterized in that the detector further comprises:

an envelope having a base, said base having a substantially flat surface which forms the supporting surface;
and
conductive wires which extend through the base to form at least two posts which protrude above the surface of the base.

18. An infrared radiation detector as claimed in claim 17, characterized in that:

the field effect transistor has a source and a drain separately electrically connected to third and fourth conductive leads protruding from the package; and the device further comprises conductive straps for electrically connecting each of the third and fourth conductive leads to a separate one of the posts.

19. An infrared radiation detector as claimed in claim 18, characterized in that the third and fourth leads each extend up from the supporting surface and each have an end portion remote from the package which extends substantially parallel to the supporting surface, the conductive straps each bearing on an end portion.

* * * * *